US008686438B2

(12) United States Patent
Hiyoshi et al.

(10) Patent No.: US 8,686,438 B2
(45) Date of Patent: Apr. 1, 2014

(54) SILICON CARBIDE SEMICONDUCTOR DEVICE AND METHOD FOR MANUFACTURING SAME

(71) Applicant: Sumitomo Electric Industries, Ltd., Osaka (JP)

(72) Inventors: Toru Hiyoshi, Osaka (JP); Takeyoshi Masuda, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/653,747

(22) Filed: Oct. 17, 2012

(65) Prior Publication Data

US 2013/0099251 A1 Apr. 25, 2013

Related U.S. Application Data

(60) Provisional application No. 61/549,458, filed on Oct. 20, 2011.

(30) Foreign Application Priority Data

Oct. 20, 2011 (JP) .................................. 2011-230447

(51) Int. Cl.
*H01L 29/15* (2006.01)
*H01L 21/336* (2006.01)

(52) U.S. Cl.
USPC ........................................... 257/77; 438/198

(58) Field of Classification Search
USPC .................... 257/77, 628, E21.421, E29.084; 438/198
See application file for complete search history.

(56) References Cited

U.S. PATENT DOCUMENTS

| 6,660,084 B1 | 12/2003 | Shiomi et al. |
| 6,734,461 B1 | 5/2004 | Shiomi et al. |
| 2009/0200559 A1 | 8/2009 | Suzuki et al. |
| 2013/0099251 A1* | 4/2013 | Hiyoshi et al. .................. 257/77 |

FOREIGN PATENT DOCUMENTS

| JP | 9-172187 A | 6/1997 |
| JP | 2000-319099 A | 11/2000 |
| JP | 2009-130069 A | 6/2009 |
| JP | 2010-147222 A | 7/2010 |
| WO | WO-01/18286 A1 | 3/2001 |
| WO | WO-01/18872 A1 | 3/2001 |

* cited by examiner

*Primary Examiner* — Mark Prenty
(74) *Attorney, Agent, or Firm* — Venable LLP; Michael A. Sartori

(57) ABSTRACT

When viewed in a plan view, a termination region (TM) surrounds an element region (CL). A first side of a silicon carbide substrate (SB) is thermally etched to form a side wall (ST) and a bottom surface (BT) in the silicon carbide substrate (SB) at the termination region (TM). The side wall (ST) has a plane orientation of one of {0-33-8} and {0-11-4}. The bottom surface (BT) has a plane orientation of {000-1}. On the side wall (ST) and the bottom surface (BT), an insulating film (8T) is formed. A first electrode (12) is formed on the first side of the silicon carbide substrate (SB) at the element region (CL). A second electrode (14) is formed on a second side of the silicon carbide substrate (SB).

10 Claims, 4 Drawing Sheets

SILICON CARBIDE SEMICONDUCTOR DEVICE AND METHOD FOR MANUFACTURING SAME

BACKGROUND OF THE INVENTION

1. Field of the Invention

The present invention relates to a silicon carbide semiconductor device and a method for manufacturing the silicon carbide semiconductor device, more particularly, a silicon carbide semiconductor device having an element region provided with a semiconductor element and a termination region surrounding the element region when viewed in a plan view, as well as a method for manufacturing such a silicon carbide semiconductor device.

2. Description of the Background Art

According to Japanese Patent Laying-Open No. 2010-147222 (Patent Literature 1), a SiC semiconductor device has a cell region provided with a MOSFET and an outer circumferential region surrounding the cell region. In the outer circumferential region, a mesa structure portion constructed by a recess is formed. At a boundary portion between the cell region and the outer circumferential region, a p type resurf layer is formed to surround the outer circumference of the cell region so as to extend from a side wall surface of a stepped portion of the mesa structure portion to a bottom surface thereof. Also, a plurality of p type guard ring layers are formed to surround the circumference of the p type resurf layer. Further, an $n^+$ type layer and a same-potential ring electrode electrically connected to the $n^+$ type layer are formed to surround the circumferences of the p type resurf layer and the p type guard ring layers, thereby forming an outer circumference breakdown voltage structure. Moreover, a source electrode and a drain electrode are provided respectively on the front-side surface side and the backside surface side of the substrate.

In the outer circumferential region (termination region), an insulating film is normally formed on the substrate (silicon carbide substrate) for the purpose of passivation. Hence, in the outer circumferential region, an interface is formed between the substrate (silicon carbide substrate) and the insulating film. As a current is more likely to flow along this interface, leakage current is more likely to flow between the source electrode and the drain electrode (first and second electrodes). As a result of inspection by the present inventors, it has been found that when a crystallographical plane orientation of the silicon carbide substrate is inappropriate in the termination region, interface state density becomes high in the interface between the silicon carbide substrate and the insulating film, with the result that leakage current is likely to flow between the first and second electrodes.

SUMMARY OF THE INVENTION

The present invention has been made to solve the foregoing problem, and has its object to provide a silicon carbide semiconductor device in which leakage current between electrodes can be suppressed, as well as a method for manufacturing such a silicon carbide semiconductor device.

A method for manufacturing a silicon carbide semiconductor device in the present invention is a method for manufacturing a silicon carbide semiconductor device having an element region provided with a semiconductor element and a termination region surrounding the element region when viewed in a plan view, and includes the following steps. There is prepared a silicon carbide substrate that is made of silicon carbide having a hexagonal single-crystal structure and that has a first side and a second side opposite to each other in a thickness direction. The first side of the silicon carbide substrate is thermally etched so as to form a side wall and a bottom surface in the silicon carbide substrate at the termination region, the side wall surrounding the element region and having a plane orientation of {0-33-8} or {0-11-4}, the bottom surface surrounding a region including the element region and the side wall and having a plane orientation of {000-1}. An insulating film is formed on the side wall and the bottom surface. A first electrode is formed on the first side of the silicon carbide substrate at the element region. A second electrode is formed on the second side of the silicon carbide substrate.

According to the manufacturing method, in the surface of the silicon carbide substrate at the portion between the first and second electrodes, the side wall and the bottom surface are formed by means of the thermal etching. The use of the thermal etching provides the side wall with a plane orientation of {0-33-8} or {0-11-4}, and provides the bottom surface with a plane orientation of {000-1}. Accordingly, an interface between the insulating film and each of the side wall and the bottom surface of the silicon carbide substrate has a low interface state density. Accordingly, generation of current caused by existence of interface states is suppressed, whereby leakage current can be suppressed between the first and second electrodes.

Preferably, the step of thermally etching includes the step of forming a channel surface in the silicon carbide substrate at the element region, the channel surface having a plane orientation of {0-33-8} or {0-11-4}. Accordingly, carrier mobility can be improved along the channel surface, thereby suppressing channel resistance. This leads to a small on-resistance of the silicon carbide semiconductor device. More preferably, the step of forming the channel surface is performed by forming a trench provided with an inner wall including the channel surface. By employing the trench structure, channels can be disposed in high density in the same area. In this way, a larger current can be obtained.

Preferably, the step of thermally etching is performed using a process gas containing a halogen element. In this way, the side wall of the trench can be spontaneously formed to correspond to the desired plane. Further, by using $SiO_2$ for the material of a mask, a high selection ratio for SiC can be obtained, whereby the trench can be securely formed. More preferably, the halogen element is chlorine. The use of the chlorine gas allows for more secure formation of the surface corresponding to the desired plane due to the same reason described above. The process gas may contain at least one of carbon tetrafluoride and sulfur hexafluoride. Also in this way, the side wall of the trench can be spontaneously formed to correspond to the desired plane. Preferably, the process gas contains oxygen gas. Accordingly, oxygen is introduced during the thermal etching, so that a carbon thin film layer (remnant of C atoms in SiC) formed on the SiC surface can be removed simultaneously with SiC.

A silicon carbide semiconductor device in the present invention is a silicon carbide semiconductor device having an element region provided with a semiconductor element and a termination region surrounding the element region when viewed in a plan view. This silicon carbide semiconductor device includes a silicon carbide substrate, first and second electrodes, and an insulating film. The silicon carbide substrate is made of silicon carbide having a hexagonal single-crystal structure, and has a first side and a second side opposite to each other in a thickness direction. The first side of the silicon carbide substrate is provided with a side wall and a bottom surface in the termination region, the side wall surrounding the element region and having a plane orientation of {0-33-8} or {0-11-4}, the bottom surface surrounding the side wall and having a plane orientation of {000-1}. The insulating film is provided on the side wall and the bottom surface. The first electrode is provided on the first side of the silicon carbide substrate at the element region. The second electrode is provided on the second side of the silicon carbide substrate.

According to this device, in the surface of the silicon carbide substrate at the portion between the first and second electrodes, the side wall and the bottom surface are provided. Because the side wall is adapted to have a plane orientation of {0-33-8} or {0-11-4} and the bottom surface is adapted to have a plane orientation of {000-1}, the interface between the insulating film and each of the side wall and the bottom surface has a low interface state density. Accordingly, generation of current caused by existence of interface states is suppressed, whereby leakage current can be suppressed between the first and second electrodes.

Preferably, in the element region, the first side of the silicon carbide substrate is provided with a channel surface having a plane orientation of {0-33-8} or {0-11-4}. Accordingly, carrier mobility can be improved along the channel surface, thereby suppressing channel resistance. This leads to a small on-resistance of the silicon carbide semiconductor device. More preferably, the channel surface is a portion of an inner wall of a trench provided in the first side of the silicon carbide substrate at the element region.

According to the present invention, the leakage current can be suppressed between the electrodes as described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
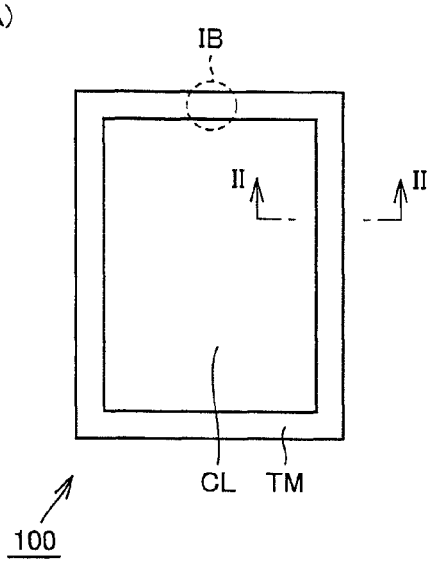
FIG. 1(A) schematically shows a surface layout of a silicon carbide semiconductor device in one embodiment of the present invention.
FIG. 1(B) is a partial enlarged view thereof at a broken line portion IB.
FIG. 1(C) is a partial plan view corresponding to the partial enlarged view.
Figure 1:
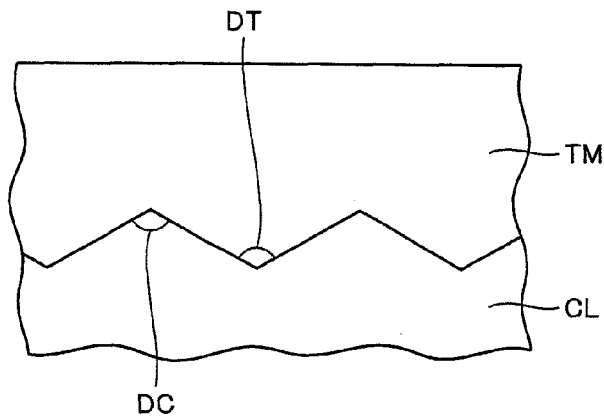
Figure 1:
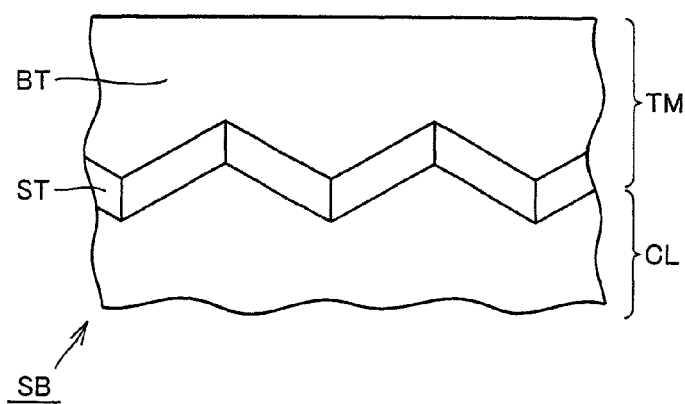

The following describes an embodiment of the present invention with reference to figures. It should be noted that in the below-mentioned figures, the same or corresponding portions are given the same reference characters and are not described repeatedly. Regarding crystallographic indications in the present specification, an individual plane is represented by ( ) and a group plane is represented by { }. To indicate a negative index of a plane, a negative symbol is put before a numeral instead of putting "-" (bar) above the numeral. For description of an angle, a system in which an omnidirectional angle is 360° is employed.

First, the following describes a gist of a configuration of a MOSFET serving as a silicon carbide semiconductor device of the present embodiment.

As shown in FIG. 1(A), when viewed in a plan view, MOSFET 100 has an element region CL provided with a transistor element (semiconductor element), and a termination region TM surrounding element region CL. As shown in FIG. 1(B), a boundary between element region CL and termination region TM may include a zigzag configuration. In this zigzag configuration, a portion projecting from element region CL to termination region TM preferably has an angle DC of 60°. Also in this zigzag configuration, a portion projecting from termination region TM to element region CL preferably has an angle DT of 60°. 60° is preferable because MOSFET 100 employs a hexagonal crystal structure having six-fold symmetry as described below. Preferably, as shown in FIG. 1(C), side walls ST are disposed along the zigzag configuration. A bottom surface BT is provided adjacent to the zigzag configuration with side walls ST interposed therebetween. It should be noted that details of side walls ST and bottom surface BT will be described later.

Figure 2:
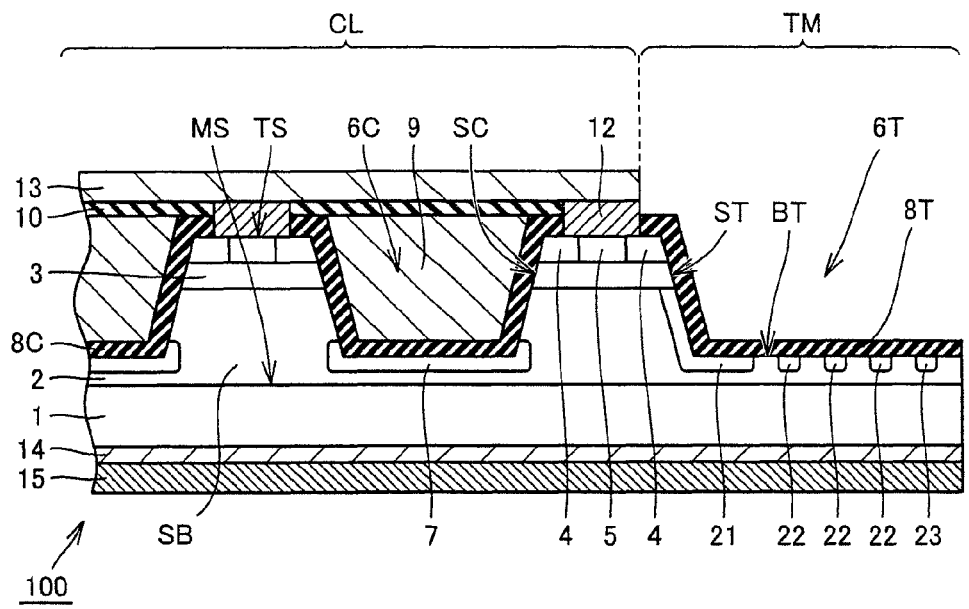
FIG. 2 is a schematic partial cross sectional view taken along a line II-II in FIG. 1.

As shown in FIG. 2, MOSFET 100 is of gate trench type. MOSFET 100 includes a silicon carbide substrate SB, an insulating film 8T, a gate insulating film 8C, a gate electrode 9, an interlayer insulating film 10, source electrodes 12, a source wire electrode 13, a drain electrode 14, and a backside surface protecting electrode 15.

Silicon carbide substrate SB is made of silicon carbide having a hexagonal single-crystal structure, and has a front side (first side) and a back side (second side) opposite to each other in the thickness direction. In element region CL at the front side of silicon carbide substrate SB, a trench 6C is provided to have a tapering shape getting wider toward the front side. In termination region TM at the front side of silicon carbide substrate SB, a terrace 6T is provided. Terrace 6T is configured by a back-side portion of the silicon carbide substrate SB projecting in the outer circumferential direction of silicon carbide substrate SB.

In element region CL at the front side of silicon carbide substrate SB, trench 6C has an inner wall whose portion provides a channel surface SC having a plane orientation of {0-33-8} or {0-11-4}. Channel surface SC is a surface along which a channel current of MOSFET 100 flows, and is constituted of a surface of p type body layer 3 described below. Channel surface SC has a plane orientation of {0-33-8} or {0-11-4}. Channel surface SC preferably has at least one of plane orientations of (0-33-8), (30-3-8), (-330-8), (03-3-8), (-303-8), and (3-30-8).

In termination region TM at the front side of silicon carbide substrate SB, terrace 6T provides side walls ST, and bottom surface BT surrounding side walls ST. In other words, side walls ST and bottom surface BT constitute terrace 6T. Each of side walls ST has a plane orientation of {0-33-8} or {0-11-4}. Side wall ST preferably has at least one of plane orientations of (0-33-8), (30-3-8), (-330-8), (03-3-8), (-303-8), and (3-30-8). Preferably, silicon carbide substrate SB is provided with side wall ST having all the above-described six plane orientations. In this case, the (0-33-8) plane, the (30-3-8)

plane, the (−330-8) plane, the (03-3-8) plane, the (−303-8) plane, and the (3-30-8) plane can be arranged to respectively make contact with six sides of a hexagon so as to constitute side wall ST. Bottom surface BT has a plane orientation of {000-1}, preferably, a plane orientation of (000-1).

In element region CL, each of source electrodes 12 is provided on the front side of silicon carbide substrate SB. Drain electrode 14 is provided on the back side of silicon carbide substrate SB. Insulating film 8T is provided on side walls ST and bottom surface BT.

The following describes a detailed configuration of MOSFET 100.

As shown in FIG. 2, silicon carbide substrate SB includes a single-crystal substrate 1 made of silicon carbide, and a silicon carbide layer epitaxially formed on a main surface MS of single-crystal substrate 1.

Single-crystal substrate 1 has n conductivity type, and is made of silicon carbide having a hexagonal single-crystal structure. Main surface MS of single-crystal substrate 1 has a plane orientation having an off angle of 5° or smaller relative to {000-1}, more preferably, having an off angle of 5° or smaller relative to (000-1).

The silicon carbide layer has a main surface TS substantially parallel to main surface MS of single-crystal substrate 1. The silicon carbide layer includes: a breakdown voltage holding layer 2, which is an epitaxial layer having n type conductivity; p type body layers 3 having p type conductivity; n type source contact layers 4 having n type conductivity; contact regions 5 having p type conductivity; an electric field relaxing region 7 having p type conductivity; a JTE (Junction Termination Extension) region 21; guard ring regions 22; and a field stop region 23. P type body layers 3, n type source contact layers 4, and contact regions 5 are provided in element region CL.

JTE region 21, guard ring regions 22, and field stop region 23 are formed in termination region TM at the front side of silicon carbide substrate SB. Each of JTE region 21, guard ring regions 22, and field stop region 23 is provided to surround element region CL when viewed in a plan view. In the case where the zigzag configuration of FIG. 1(B) is provided, each of JTE region 21, guard ring regions 22, and field stop region 23 may have a zigzag configuration corresponding to the foregoing zigzag configuration, or may extend in the form of straight line not strictly along the foregoing zigzag configuration. JTE region 21 has the same conductivity type as that of p type body layer 3 and is connected to p type body layer 3. When viewed in a plan view, guard ring regions 22 surround JTE region 21 and have a conductivity type different from that of breakdown voltage holding layer 2. Field stop region 23 surrounds guard ring regions 22 when viewed in a plan view, has the same conductivity type as that of breakdown voltage holding layer 2, and has an impurity concentration higher than that of breakdown voltage holding layer 2.

Breakdown voltage holding layer 2 is formed on main surface MS of single-crystal substrate 1. Each of p type body layers 3 is formed on breakdown voltage holding layer 2. On p type body layer 3, n type source contact layer 4 is formed. P type contact region 5 is formed to be surrounded by n type source contact layers 4.

On the inner wall of trench 6C, gate insulating film 8C is formed. Gate insulating film 8C extends onto the upper surface of each of n type source contact layers 4. On this gate insulating film 8C, gate electrode 9 is formed to fill the inside of trench 6C. Gate electrode 9 has an upper surface substantially as high as the upper surface of a portion of gate insulating film 8C on the upper surface of each of n type source contact layers 4.

Interlayer insulating film 10 is formed to cover gate electrode 9 as well as the portion of gate insulating film 8C on the upper surface of each of n type source contact layers 4. By removing portions of interlayer insulating film 10 and gate insulating film 8C, openings are formed to expose portions of n type source contact layers 4 and p type contact regions 5. Source electrodes 12 are formed in contact with p type contact regions 5 and the portions of n type source contact layers 4 so as to fill the inside of the openings. Source wire electrode 13 is formed in contact with the upper surface of each of source electrodes 12 so as to extend on the upper surface of interlayer insulating film 10. Further, drain electrode 14 is formed on the backside surface of single-crystal substrate 1 opposite to its main surface on which breakdown voltage holding layer 2 is formed. This drain electrode 14 is an ohmic electrode. Drain electrode 14 has a surface which is opposite to its surface facing single-crystal substrate 1 and on which backside surface protecting electrode 15 is formed.

The following briefly describes operations of MOSFET 100. Referring to FIG. 2, when a voltage equal to or smaller than a threshold value is applied to gate electrode 9, i.e., when the semiconductor device is in an OFF state, p type body layer 3 and breakdown voltage holding layer 2 of n type conductivity are reverse-biased. Hence, it is in a non-conductive state. On the other hand, when gate electrode 9 is fed with a positive voltage, an inversion layer is formed in the channel region near a region of p type body layer 3 in contact with gate insulating film 8C. Accordingly, n type source contact layer 4 and breakdown voltage holding layer 2 are electrically connected to each other. As a result, a current flows between source electrode 12 and drain electrode 14.

The following describes a method for manufacturing MOSFET 100.

Figure 3:
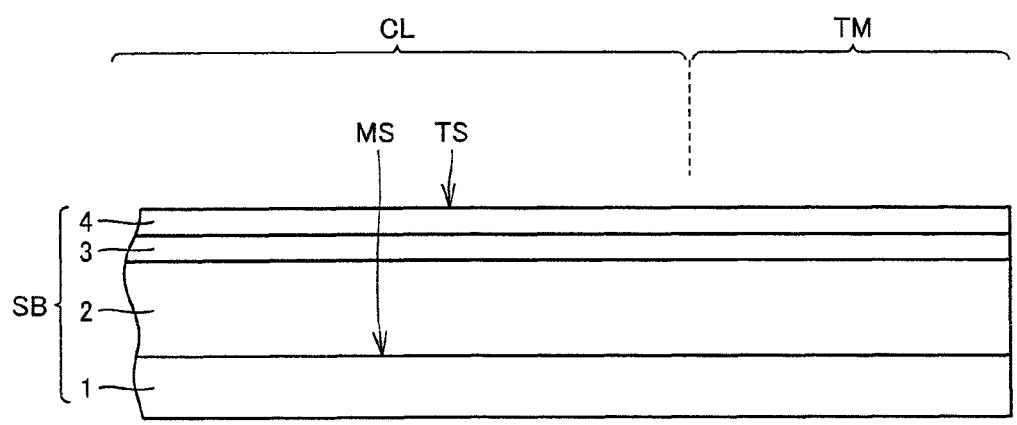
FIG. 3 is a partial cross sectional view schematically showing a first step of a method for manufacturing the silicon carbide semiconductor device in the embodiment of the present invention, in a field of view corresponding to FIG. 2.

As shown in FIG. 3, silicon carbide substrate SB is prepared which is made of silicon carbide having a hexagonal single-crystal structure and has the front side and the back side opposite to each other in the thickness direction. This is specifically described as follows.

First, single-crystal substrate 1 formed of silicon carbide is prepared. Single-crystal substrate 1 has a hexagonal single-crystal structure. Further, single-crystal substrate 1 is provided with main surface MS described above.

Next, on main surface MS, an epitaxial layer of silicon carbide with n type conductivity is formed. The epitaxial layer serves as breakdown voltage holding layer 2. Breakdown voltage holding layer 2 is formed by means of epitaxial growth employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as a donor impurity, for example. This breakdown voltage holding layer 2 can be adapted to contain the n type impurity at a concentration of, for example, not less than $5 \times 10^{15}$ $cm^{-3}$ and not more than $5 \times 10^{16}$ $cm^{-3}$.

Next, ions are implanted into the upper surface layer of breakdown voltage holding layer 2, thereby forming p type body layer 3 and n type source contact layer 4. In the ion implantation for forming p type body layer 3, an acceptor impurity is used, such as aluminum (Al). Further, ions of the donor impurity are implanted into breakdown voltage holding layer 2 thus having p type body layer 3 formed therein, thereby forming n type source contact layer 4. An exemplary, usable donor impurity is phosphorus or the like. In this way, silicon carbide substrate SB is formed.

Figure 4:
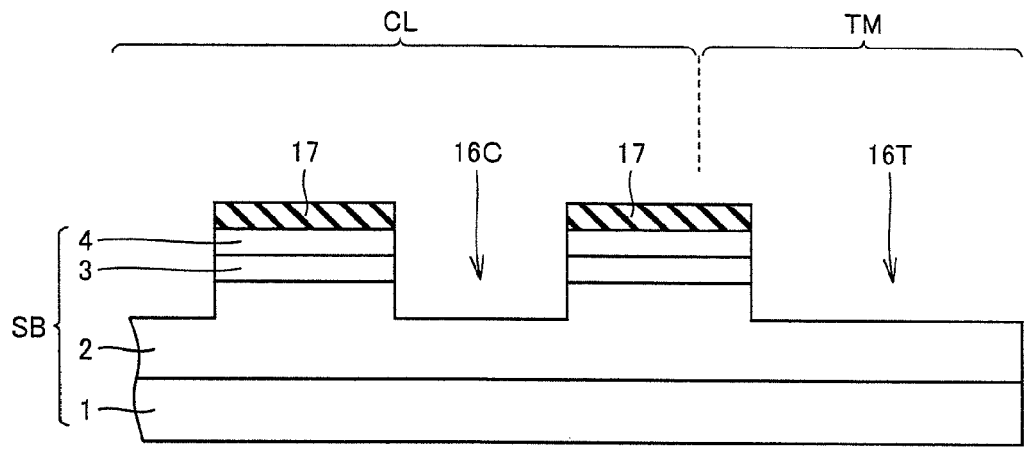
FIG. 4 is a partial cross sectional view schematically showing a second step of the method for manufacturing the silicon carbide semiconductor device in the embodiment of the present invention, in the field of view corresponding to FIG. 2.

Next, as shown in FIG. 4, a trench 16C is provided to extend through n type source contact layer 4 and p type body layer 3 in this order from the front side of silicon carbide substrate SB in element region CL. The location of trench 16C corresponds to the location in which trench 6C (FIG. 2) is to be provided. Further, a terrace 16T is provided by removing n type source contact layer 4 and p type body layer 3 from the front side of silicon carbide substrate SB in termination region TM. The location of terrace 16T corresponds to the location in which terrace 6T (FIG. 2) is to be provided. Each of trench 16C and terrace 16T has side walls substantially parallel to the thickness direction as shown in FIG. 4. The following describes a method for forming trench 16C and terrace 16T.

First, a mask layer 17 is formed on the upper surface (main surface TS in FIG. 3) of n type source contact layer 4. As mask layer 17, an insulating film such as a silicon oxide film can be used. As a method for forming mask layer 17, the following process can be employed, for example. First, a silicon oxide film is formed on the upper surface of n type source contact layer 4 by means of the CVD method or the like. Then, a resist film (not shown) having a predetermined opening pattern is formed on the silicon oxide film by means of a photolithography method. Using the resist film as a mask, a portion of the silicon oxide film is removed by etching. Thereafter, the resist film is removed. As a result, mask layers 17 are formed which have an opening pattern in conformity with regions where trench 16C and terrace 16T are to be formed as shown in FIG. 4.

Then, using mask layers 17 as a mask, portions of n type source contact layer 4, p type body layer 3, and breakdown voltage holding layer 2 are removed by means of etching. An exemplary, usable etching method is reactive ion etching (RIE) or ion milling. As the RIE, inductively coupled plasma (ICP) RIE can be used in particular. Specifically, ICP-RIE can be employed which utilizes $SF_6$ or a mixed gas of $SF_6$ and $O_2$ as reactive gas, for example. With such etching, trench 16C and terrace 16T are formed.

Figure 5:
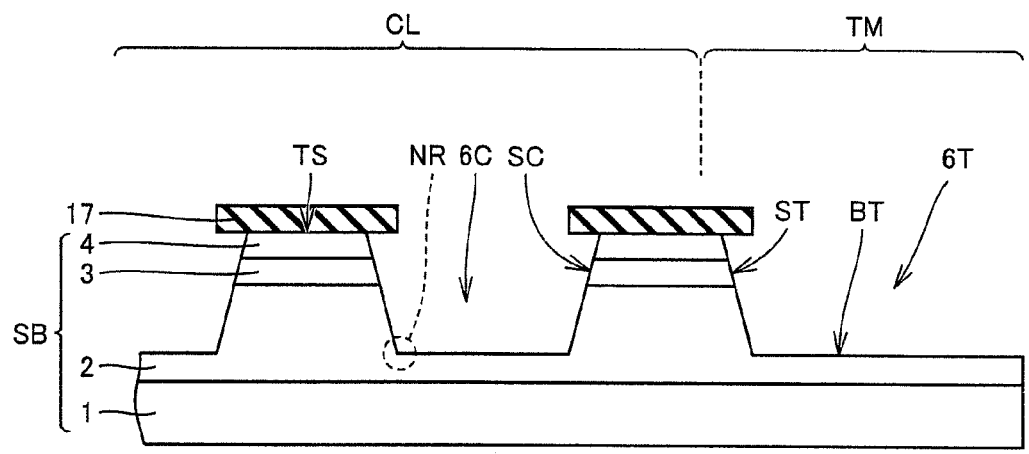
FIG. 5 is a partial cross sectional view schematically showing a third step of the method for manufacturing the silicon carbide semiconductor device in the embodiment of the present invention, in the field of view corresponding to FIG. 2.

Next, as shown in FIG. 5, trench 6C is formed in element region CL, and terrace 6T is formed in the termination region. They are formed through thermal etching for the front side of silicon carbide substrate SB. Here, the term "thermal etching" is intended to indicate etching in which an object to be etched is exposed to etching gas at a high temperature. The thermal etching substantially has no physical etching action. With the formation of trench 6C, channel surface SC having a plane orientation of {0-33-8} or {0-11-4} is spontaneously formed in silicon carbide substrate SB at element region CL as a portion of the inner wall of trench 6C. With the formation of terrace 6T, side walls ST and bottom surface BT are spontaneously formed in silicon carbide substrate SB at termination region TM. Each of side walls ST surrounds element region CL and has a plane orientation of {0-33-8} or {0-11-4}. Bottom surface BT surrounds the region including element region CL and side walls ST, and has a plane orientation of {000-1}.

The process gas in the thermal etching contains a halogen element. More preferably, the halogen element is chlorine. Instead of or in addition to chlorine, the process gas may contain at least one of carbon tetrafluoride and sulfur hexafluoride. Preferably, the process gas further contains oxygen gas in addition to the gas containing the halogen element.

The following illustrates a procedure of the etching in the case where the process gas is a mixed gas of chlorine gas and oxygen gas. Reaction is likely to proceed under conditions that $0.5 \leq x \leq 2.0$ and $1.0 \leq y \leq 2.0$ are satisfied in a reaction formula expressed as $SiC+mO_2+nCl_2 \rightarrow SiCl_x+CO_y$, where m, n, x, and y are positive numbers. The reaction proceeds the most under conditions that x=4 and y=2. It should be noted that m and n described above respectively represent amounts of the oxygen gas and the chlorine gas actually reacting, and are therefore different from amounts of the oxygen gas and the chlorine gas supplied as the process gas. The present inventors have found that a ratio of the flow rate of oxygen to the flow rate of chlorine in this thermal etching is preferably not less than 0.1 and not more than 2.0. More preferably, the lower limit of this ratio is 0.25. In this case, in silicon carbide substrate SB, the surfaces corresponding to a {0-33-8} or {0-11-4} plane and a {000-1} plane can be spontaneously formed more securely.

It should be noted that the process gas may contain a carrier gas in addition to the reactive gas such as the chlorine gas and the oxygen gas. An exemplary; usable carrier gas is nitrogen ($N_2$) gas, argon gas, helium gas, or the like.

Preferably, the heat treatment temperature in the thermal etching is not less than 700° C. and not more than 1200° C. The lower limit of this temperature is more preferably 800° C., further preferably 900° C. Further, the upper limit of this temperature is more preferably 1100° C., further preferably 1000° C. In this case, etching rate can be of a sufficiently practical value. When the heat treatment temperature is set at not less than 700° C. and not more than 1000° C., a rate of etching SiC is approximately, for example, 70 μm/hr. When using silicon oxide ($SiO_2$) as the material of each of mask layers 17, a selection ratio of SiC to $SiO_2$ can be very large. Accordingly, mask layer 17 made of $SiO_2$ is not substantially etched during etching of SiC.

After the thermal etching, mask layers 17 are removed by means of etching or the like.

Figure 6:
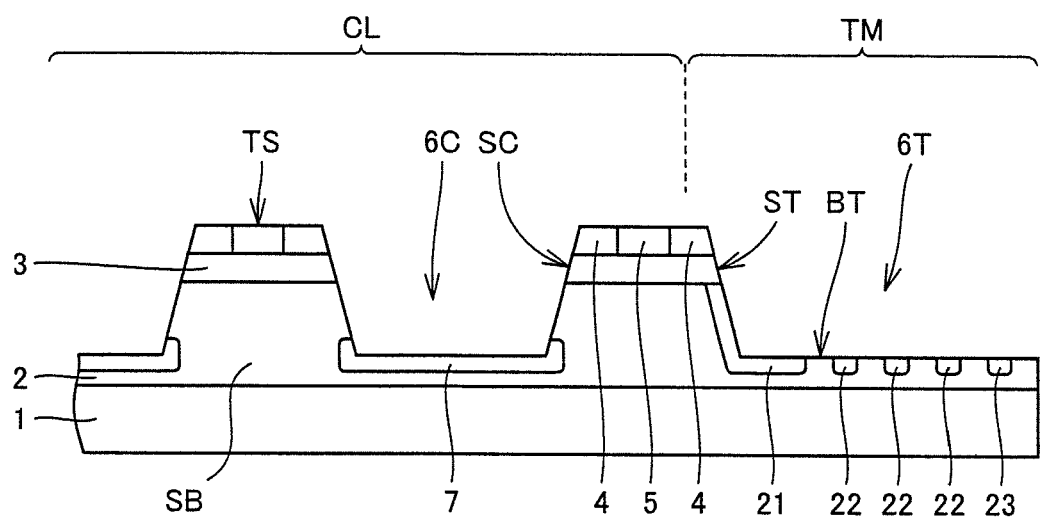
FIG. 6 is a partial cross sectional view schematically showing a fourth step of the method for manufacturing the silicon carbide semiconductor device in the embodiment of the present invention, in the field of view corresponding to FIG. 2.

Then, as shown in FIG. 6, contact regions 5, electric field relaxing region 7, JTE region 21, guard ring regions 22, and field stop region 23 are formed. They can be formed by performing selective ion implantation using a mask.

Then, activation annealing is performed to activate the impurity implanted by means of the above-described ion implantation. The activation annealing may be performed without forming a particular cap layer on the surface of the epitaxial layer made of silicon carbide. In particular, even when the activation annealing treatment is performed without forming a protecting film such as the cap layer on the surface thereof in the case where the above-described {0-33-8} plane or {0-11-4} plane is employed, a property of the surface is never deteriorated and sufficient surface smoothness can be maintained.

Referring to FIG. 2 again, insulating film 8T is formed on silicon carbide substrate SB at termination region TM. Accordingly, insulating film 8T is formed on side walls ST and bottom surface BT. Further, gate insulating film 8C is formed on silicon carbide substrate SB at element region CL. Insulating film 8T and gate insulating film 8C may be collectively formed. Each of insulating film 8T and gate insulating film 8C can be formed by thermally oxidizing the front side of silicon carbide substrate SB, for example.

Next, gate electrode 9 is formed on gate insulating film 8C so as to fill the inside of trench 6C. As a method for forming gate electrode 9, the following method can be used, for example. First, a sputtering method or the like is employed to form a conductor film on gate insulating film 8C. The conductor film is to be the gate electrode extending to the inside of trench 6C and to a region on p type contact region 5. The conductor film can be made of any material such as a metal as long as the material has conductivity. Thereafter, an appropriate method such as an etch back method or a CMP (Chemical Mechanical Polishing) method is used to remove a portion of the conductor film formed on regions other than the inside of trench 6C. As a result, the conductor film filling the inside of trench 6C remains to constitute gate electrode 9.

Next, interlayer insulating film 10 is formed to cover the upper surface of gate electrode 9 and the upper surface of gate insulating film 8C exposed on p type contact region 5. Interlayer insulating film 10 can be made of any material as long as the material is insulative. Further, a resist film (not shown) having a pattern is formed on interlayer insulating film 10, using the photolithography method. The resist film is provided with an opening pattern formed in conformity with a region on p type contact region 5.

Using this resist film as a mask, portions of interlayer insulating film 10 and gate insulating film 8C are removed by means of etching. As a result, openings are formed to extend through interlayer insulating film 10 and gate insulating film 8C. Each of openings has a bottom portion at which contact region 5 and a portion of n type source contact layer 4 are exposed. Thereafter, a conductor film to serve as source electrode 12 is formed to fill the inside of the opening and cover the upper surface of the above-described resist film. Thereafter, the resist film is removed using a chemical solution or the like, thereby simultaneously removing (lifting off) the portion of the conductor film formed on the resist film. As a result, the conductor film filling the inside of the opening constitutes source electrode 12. This source electrode 12 is an ohmic electrode making ohmic contact with contact region 5 and n type source contact layer 4.

Further, drain electrode 14 is formed on the backside surface of single-crystal substrate 1 (the surface thereof opposite to main surface MS on which breakdown voltage holding layer 2 is formed). Drain electrode 14 can be made of any material as long as the material allows for ohmic contact with single-crystal substrate 1.

Thereafter, the sputtering method or the like is employed to form source wire electrode 13 and backside surface protecting electrode 15. Source wire electrode 13 makes contact with each of the upper surfaces of source electrodes 12, and extends on the upper surface of interlayer insulating film 10. Backside surface protecting electrode 15 is formed on the surface of drain electrode 14.

In this way, MOSFET 100 (FIG. 2) is manufactured.

According to the present embodiment, in the surface of silicon carbide substrate SB at the portion between source electrode 12 and drain electrode 14, side walls ST and bottom surface BT are provided by means of the thermal etching. Accordingly, leakage current, which flows between source electrode 12 and drain electrode 14 via the surface of silicon carbide substrate SB, flows through side surfaces ST and bottom surface BT. The use of the thermal etching provides each of side walls ST with a plane orientation of {0-33-8} or {0-11-4}, and provides bottom surface BT with a plane orientation of {000-1}. Accordingly, the interface between insulating film 8T and each of side walls ST and bottom surface BT has a low interface state density. Accordingly, generation of current caused by existence of interface states is suppressed, whereby leakage current can be suppressed between the electrodes, i.e., between source electrode 12 and drain electrode 14.

The step of thermally etching includes the step of forming channel surface SC having a plane orientation of {0-33-8} or {0-11-4}, in silicon carbide substrate SB at element region CL. Accordingly, carrier mobility can be improved along channel surface SC, thereby suppressing channel resistance. In this way, on-resistance of MOSFET 100 can be made small.

Further, the step of forming the channel surface is performed by forming trench 6C provided with the inner wall including the channel surface. By employing the trench structure, channels can be disposed in high density in the same area. In this way, a larger current can be obtained. Further, because the final shape of trench 6C is formed by the thermal etching, a sub trench, which is a region locally formed deeply, can be avoided from being formed in a corner portion NR (FIG. 5) of trench 6C. It should be noted that such a sub trench is likely to be formed when the final shape of the trench is formed by means of an etching method having physical etching action. For example, such a sub trench can be observed when formed by means of RIE.

Further, the step of thermally etching is performed using the process gas containing the halogen element. Accordingly, the side wall of trench 6C is spontaneously formed to correspond to a desired plane, i.e., the {0-33-8} plane or the {01-1-4} plane.

Further, by using $SiO_2$ for the material of mask layer 17, a high selection ratio for SiC can be obtained, whereby trench 6C can be securely formed.

More preferably, the halogen element is chlorine. The use of the chlorine gas allows for more secure formation of the surface corresponding to the desired plane due to the same reason described above. The process gas may contain at least one of carbon tetrafluoride and sulfur hexafluoride. Also in this way, the side wall of trench 6C is spontaneously formed to correspond to the desired plane.

Preferably, the process gas contains oxygen gas. Accordingly, oxygen is introduced during the thermal etching, so that a carbon thin film layer (remnant of C atoms in SiC) formed on the SiC surface can be removed simultaneously with SiC.

It should be noted that in the present embodiment, insulating film 8T in termination region TM and gate insulating film 8C in element region CL are simultaneously formed, but the insulating film in the termination region and the gate insulating film in the element region may be formed separately.

Further, in termination region TM, JTE region 21, each guard ring region 22, and field stop region 23 are provided, but at least one of them may be omitted.

Further, MOSFET 100 is of n channel type, but the silicon carbide semiconductor device may be of p channel type when carrier mobility is not required to be as large as that in the n channel type. In this case, a configuration can be employed in which n type conductivity and p type conductivity in the above-described embodiment are replaced with each other.

Further, the silicon carbide semiconductor device may be a MISFET (Metal Insulator Semiconductor Field Effect Transistor) other than the MOSFET or may be a silicon carbide semiconductor device other than the MISFET. An exemplary silicon carbide semiconductor device other than the MISFET is an IGBT (Insulated Gate Bipolar Transistor).

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device having an element region provided with a semiconductor element and a termination region surrounding said element region when viewed in a plan view, comprising the steps of:

preparing a silicon carbide substrate that is made of silicon carbide having a hexagonal single-crystal structure and that has a first side and a second side opposite to each other in a thickness direction;

thermally etching said first side of said silicon carbide substrate so as to form a side wall and a bottom surface in said silicon carbide substrate at said termination region, said side wall surrounding said element region and having a plane orientation of one of {0-33-8} and {0-11-4}, said bottom surface surrounding a region including said element region and said side wall and having a plane orientation of {000-1};
forming an insulating film on said side wall and said bottom surface;
forming a first electrode on said first side of said silicon carbide substrate at said element region; and
forming a second electrode on said second side of said silicon carbide substrate.

2. The method for manufacturing the silicon carbide semiconductor device according to claim 1, wherein the step of thermally etching includes the step of forming a channel surface in said silicon carbide substrate at said element region, said channel surface having a plane orientation of one of {0-33-8} and {0-11-4}.

3. The method for manufacturing the silicon carbide semiconductor device according to claim 2, wherein the step of forming said channel surface is performed by forming a trench provided with an inner wall including said channel surface.

4. The method for manufacturing the silicon carbide semiconductor device according to claim 1, wherein the step of thermally etching is performed using a process gas containing a halogen element.

5. The method for manufacturing the silicon carbide semiconductor device according to claim 4, wherein said halogen element is chlorine.

6. The method for manufacturing the silicon carbide semiconductor device according to claim 4, wherein said process gas contains at least one of carbon tetrafluoride and sulfur hexafluoride.

7. The method for manufacturing the silicon carbide semiconductor device according to claim 4, wherein said process gas contains oxygen gas.

8. A silicon carbide semiconductor device having an element region provided with a semiconductor element and a termination region surrounding said element region when viewed in a plan view, comprising:
a silicon carbide substrate that is made of silicon carbide having a hexagonal single-crystal structure and that has a first side and a second side opposite to each other in a thickness direction, said first side of said silicon carbide substrate being provided with a side wall and a bottom surface in said termination region, said side wall surrounding said element region and having a plane orientation of one of {0-33-8} and {0-11-4}, said bottom surface surrounding said side wall and having a plane orientation of {000-1};
an insulating film provided on said side wall and said bottom surface;
a first electrode provided on said first side of said silicon carbide substrate at said element region; and
a second electrode provided on said second side of said silicon carbide substrate.

9. The silicon carbide semiconductor device according to claim 8, wherein in said element region, said first side of said silicon carbide substrate is provided with a channel surface having a plane orientation of one of {0-33-8} and {0-11-4}.

10. The silicon carbide semiconductor device according to claim 9, wherein said channel surface is a portion of an inner wall of a trench provided in said first side of said silicon carbide substrate at said element region.

* * * * *